(12) United States Patent
Ochiai et al.

(10) Patent No.: US 12,005,518 B2
(45) Date of Patent: Jun. 11, 2024

(54) LASER APPARATUS

(71) Applicant: MITSUBISHI HEAVY INDUSTRIES, LTD., Tokyo (JP)

(72) Inventors: Atsushi Ochiai, Tokyo (JP); Kazunori Masukawa, Tokyo (JP)

(73) Assignee: MITSUBISHI HEAVY INDUSTRIES, LTD., Tokyo (JP)

( * ) Notice: Subject to any disclaimer, the term of this patent is extended or adjusted under 35 U.S.C. 154(b) by 661 days.

(21) Appl. No.: 17/269,572

(22) PCT Filed: Jul. 5, 2019

(86) PCT No.: PCT/JP2019/026860
§ 371 (c)(1),
(2) Date: Feb. 19, 2021

(87) PCT Pub. No.: WO2020/105216
PCT Pub. Date: May 28, 2020

(65) Prior Publication Data
US 2021/0308786 A1    Oct. 7, 2021

(30) Foreign Application Priority Data

Nov. 19, 2018 (JP) .................. 2018-216796

(51) Int. Cl.
| B23K 26/03 | (2006.01) |
| B23K 26/035 | (2014.01) |
| B23K 26/08 | (2014.01) |

(52) U.S. Cl.
CPC .......... *B23K 26/032* (2013.01); *B23K 26/035* (2015.10); *B23K 26/0869* (2013.01)

(58) Field of Classification Search
CPC ................ B23K 26/032; B23K 26/035; B23K 26/0869; G02B 6/3548; G02B 6/3598;
(Continued)

(56) References Cited

U.S. PATENT DOCUMENTS

| 4,348,075 A | 9/1982 | Gottlieb et al. |
| 8,995,038 B1 | 3/2015 | Anderson et al. |

FOREIGN PATENT DOCUMENTS

| CN | 102545056 A | 7/2012 |
| JP | 2005227324 A | 8/2005 |

(Continued)

OTHER PUBLICATIONS

Office Action for Japanese Application No. 2020-558078 dated Oct. 6, 2021; 6pp.

(Continued)

*Primary Examiner* — Robert G Bachner
(74) *Attorney, Agent, or Firm* — HAUPTMAN HAM, LLP

(57) ABSTRACT

Changing non-mechanically a direction of irradiating a laser. The laser apparatus includes an optical device and a laser irradiation device. The optical device has two reflection mirrors facing each other, and a waveguide between the two reflection mirrors. The laser irradiation device irradiates the optical device with laser. The optical device is configured so that at least a portion of the laser travels on the waveguide by being reflected by the two reflection mirrors in order. The optical device has an output surface that emits a portion of the laser. The laser irradiation device has a plurality of irradiation parts including a first irradiation part that irradiates a first laser and a second irradiation part that irradiates a second laser. When viewed from a normal direction of the output surface, a traveling direction of the first laser is not parallel to a traveling direction of the second laser.

8 Claims, 6 Drawing Sheets

(58) Field of Classification Search
CPC ........ G02F 1/31; H01S 5/18394; H01S 5/183;
H01S 5/4025; H01S 5/0071; H01S
5/4037; H01S 5/50
See application file for complete search history.

(56) References Cited

FOREIGN PATENT DOCUMENTS

| JP | 2008004644 A | 1/2008 |
| JP | 2013016591 A | 1/2013 |
| JP | 2014145935 A | 8/2014 |
| JP | 2017157609 A | 9/2017 |

OTHER PUBLICATIONS

International Preliminary Report on Patentability for International Application No. PCT/JP2019/026860 dated Jul. 5, 2019; 6pp.
Kondo Keisuke et al. "Two-Dimensional Beam Steering Using Slow-Light Waveguide Deflector Array with Optical Gain" 2018 Conference on Laser and Electro-Optics (CLEO), OSA, May 13, 2018; 2pp.
Extended European Search Report for European Application No. 19886598.2 dated Nov. 4, 2021; 10pp.

F I G. 1
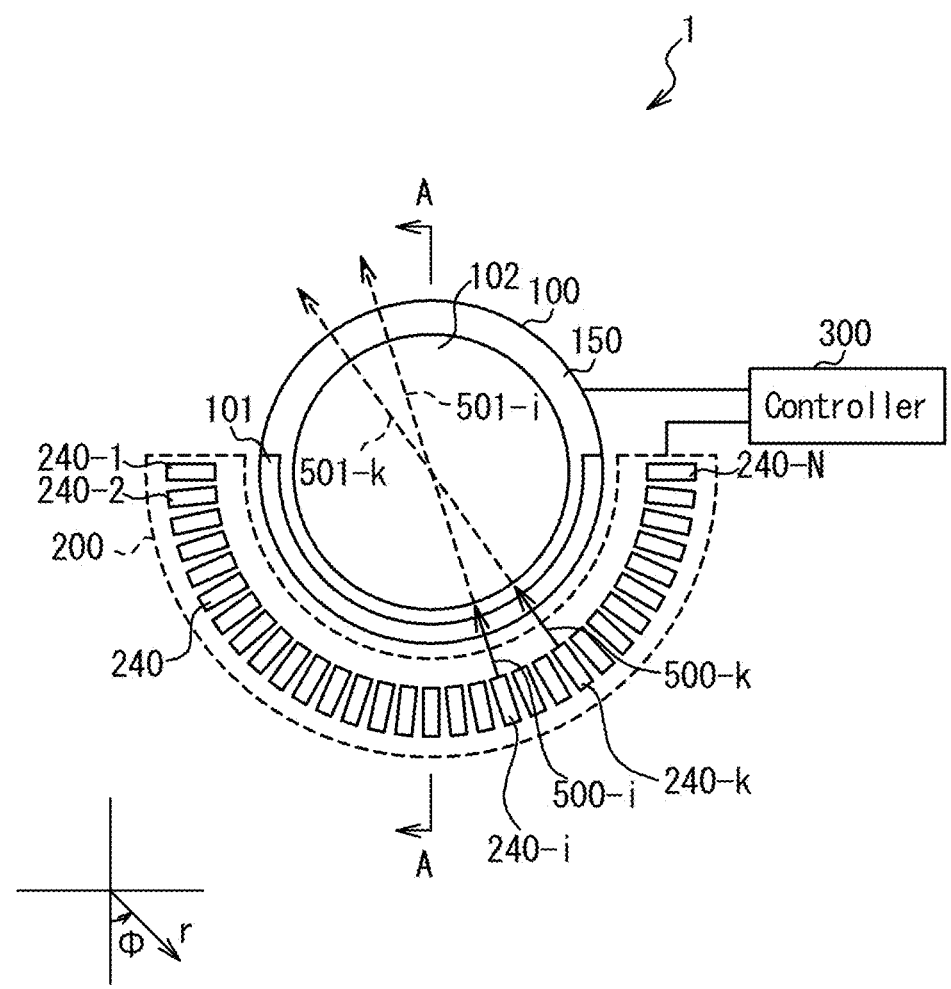

LASER APPARATUS

RELATED APPLICATIONS

The present application is a National Phase of International Application Number PCT/JP2019/026860 filed Jul. 5, 2019 and claims priority to Japanese Application Number 2018-216796 filed Nov. 19, 2018.

TECHNICAL FIELD

The present invention relates to a laser apparatus.

BACKGROUND ART

Changing laser irradiation direction is required to irradiate laser in an arbitrary direction. Patent Literature 1 discloses a technology of changing laser irradiation direction based on a wavelength. The apparatus discloses in the Patent Literature 1 is provided with a waveguide provided with two distributed Bragg reflection mirrors, a light incident port to make light incident in the waveguide and a light emission port to emit light guided through the waveguide.

Patent Literature 2 discloses a technology of changing irradiation direction of high-power laser non-mechanically. The apparatus disclosed in the Patent Literature 2 is provided with a first vertical cavity surface emitting laser (VCSEL) long in a first direction and a driving circuit that injects current to the first VCSEL. Incident light, that incidents in the incident port provided at an end in the first direction of the first VCSEL, travels inside the first VCSEL along the first direction, while being reflected in a vertical direction, and is emitted from the emitting port on an upper surface of the first VCSEL as emission light. It is disclosed that a direction in which this emission light is emitted is inclined to the first direction from a normal direction of the emitting port based on a wavelength of the incident light and the like.

CITED LIST

Patent Literature

[Patent Literature 1] Japanese Patent Publication No. 2013-16591
[Patent Literature 2] Japanese Patent Publication No. 2017-157609

SUMMARY OF INVENTION

The present invention has been made in view of the above circumstances and one objective thereof is to provide a laser apparatus that changes a direction of irradiating laser non-mechanically. Other objectives will be understood from following disclosures and explanations of embodiments.

In order to achieve the above objective, a laser apparatus according to an embodiment is provided with an optical device and a laser irradiation device. The optical device has two reflection mirrors arranged to face each other and a waveguide formed between the two reflection mirrors. The laser irradiation device irradiates the optical device with laser. The optical device is configured so that at least a portion of the laser travels on the waveguide by being reflected by the two reflection mirrors in order. The optical device has an output surface that emits a portion of the laser. The laser irradiation device has a plurality of irradiation parts including a first irradiation part that irradiates a first laser and a second irradiation part that irradiates a second laser. A traveling direction of the first laser is not parallel to a traveling direction of the second laser in the waveguide when viewed from a normal direction of the output surface.

According to the present invention, a direction of irradiating laser can be changed non-mechanically.

BRIEF DESCRIPTION OF DRAWINGS

FIG. 1 is a schematic diagram that shows an example of a laser apparatus according to an embodiment.

DESCRIPTION OF EMBODIMENTS

Figure 2:
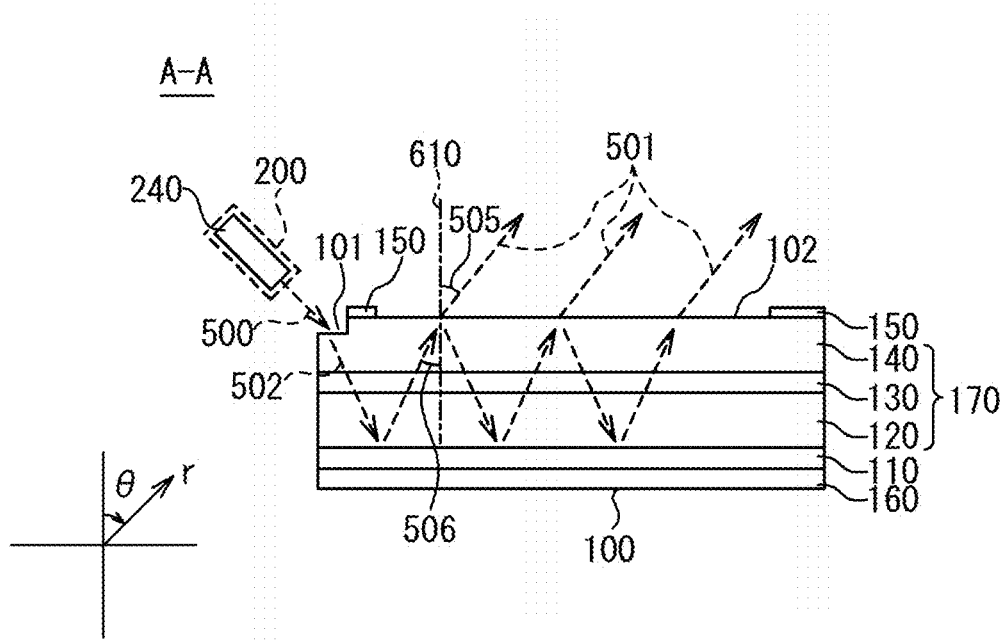
FIG. 2 is an A-A cross-sectional view of the laser apparatus in FIG. 1.

As shown in FIG. 1, a laser apparatus 1 according to an embodiment is provided with an optical device 100, a laser irradiation device 200 and a controller 300. The laser irradiation device 200 is arranged around the optical device 100 and is configured to irradiate an input surface 101 of the optical device 100 with laser from a plurality of directions. The optical device 100 is configured to emit incident laser 500 irradiated to the input surface 101 as output laser 501 from an output surface 102. A direction of emitting the output laser 501 is determined based on a wavelength and an irradiation direction of the incident laser 500 that the laser irradiation device 200 irradiates to the optical device 100. The wavelength and the irradiation direction of the incident laser 500 are configured so as to be controlled by the controller 300.

The incident laser 500 is a generic term of a first incident laser 500-1 (not illustrated), a second incident laser 500-2 (not illustrated), . . . , an i-th incident laser 500-$i$ (not illustrated), . . . , a k-th incident laser 500-$k$ (not illustrated), . . . and an N-th incident laser 500-N (not illustrated) of which irradiation directions are different. The output laser 501 is a generic term of a first output laser 501-1 (not illustrated), a second output laser 501-2 (not illustrated), . . . , an i-th output laser 501-$i$ (not illustrated), . . . , a k-th output laser 501-$k$ (not illustrated), . . . and an N-th output laser 501-N (not illustrated) that are emitted when each incident laser 500 is irradiated to the optical device 100. When the first incident laser 500-1 is irradiated to the optical device 100, the optical device 100 emits the first output laser 501-1. When the second incident laser 500-2 is irradiated to the optical device 100, the optical device 100 emits the second output laser 501-2. When the i-th incident laser 500-$i$ is irradiated to the optical device 100, the optical device 100 emits the i-th output laser 501-$i$. When the k-th incident laser 500-$k$ is irradiated to the optical device 100, the optical device 100 emits the k-th output laser 501-$k$. When the N-th incident laser 500-N is irradiated to the optical device 100, the optical device 100 emits the N-th output laser 501-N.

As shown in FIGS. 1 and 2, for example, the optical device 100 is formed in a cylindrical shape and has the input surface 101 and the output surface 102 on one bottom surface. The first input surface 101 is, for example, a plane arranged at an edge of this bottom surface and is configured to be irradiated by the laser irradiation device 200 with the incident laser 500. The output surface 102 is a plane arranged on this bottom surface and is configured to emit the output laser 501. The output surface 102 may be formed, for example, in a disk shape in a center of this bottom surface. The input surface 101 may be formed on another bottom surface different from the output surface 102.

The optical device 100 is formed with a second reflection mirror 120, an active layer 130, a first reflection mirror 140 and a first electrode 150 laminated in order on one surface of a substrate 110. A boundary of each layer is arranged, for example, in parallel to a bottom surface of the optical device 100 such as the output surface 102. In addition, a second electrode 160 is arranged adjacent to another surface of the substrate 110.

The first reflection mirror 140 has an input surface 101 at an edge of a surface thereof, for example. The incident laser 500, that is irradiated by the laser irradiation device 200, incidents on the first reflection mirror 140 from the input surface 101. For this reason, the input surface 101 is configured so that its reflectance is lower compared to other parts of the surface of the first reflection mirror 140. For example, the first reflection mirror 140 is formed so that a thickness of the first reflection mirror 140 at a location where the input surface 101 is arranged is thinner than a thickness of the first reflection mirror 140 at other locations. The input surface 101 is, for example, a plane parallel to the output surface 102.

The laser incident from the input surface 101 travels inside the optical device 100 as a propagation laser 502. The propagation laser 502 is a generic term of a first propagation laser 502-1, a second propagation laser 502-2, . . . , and an N-th propagation laser 502-N that travel inside the optical device 100 when each incident laser 500 is irradiated. In particular, when the first incident laser 500-1 is irradiated to the optical device 100, it travels inside the optical device 100 as the first propagation laser 502-1. When the second incident laser 500-2 is irradiated to the optical device 100, it travels inside the optical device 100 as the second propagation laser 502-2. When the N-th incident laser 500-N is irradiated to the optical device 100, it travels inside the optical device 100 as the N-th propagation laser 502-N.

The first reflection mirror 140 and the second reflection mirror 120 are arranged to face each other and a wave guide 170 is formed between the first reflection mirror 140 and the second reflection mirror 120. In particular, the second reflection mirror 120 reflects the propagation laser 502 incident from the input surface 101. A portion of the propagation laser 502 reflected by the second reflection mirror 120 is reflected by the first reflection mirror 140. The propagation laser 502 reflected by the first reflection mirror 140 is reflected by the second reflection mirror 120. By doing so, the propagation laser 502 travels on the waveguide 170 by being reflected by the first reflection mirror 140 and the second reflection mirror 120 in order. The first reflection mirror 140 and the second reflection mirror 120 are formed to carry out Bragg reflection and include a Distributed Bragg Reflector (DBR) for example. The waveguide 170 includes a planar waveguide for example.

The first reflection mirror 140 transmits a portion of the propagation laser 502 and reflects another portion thereof. The propagation laser 502 reflected by the first reflection mirror 140 travels inside the optical device 100. The propagation laser 502 transmitted by the first reflection mirror 140 is emitted as the output laser 501 from the output surface 102 formed on the surface of the first reflection mirror 140.

On the other hand, the second reflection mirror 120 may reflect the whole propagation laser 502. For this reason, the reflectance of the first reflection mirror 140 may be configured to be lower than the reflectance of the second reflection mirror 120. For example, the thickness of the first reflection mirror 140 may be thinner than the thickness of the second reflection mirror 120.

The active layer 130 is provided between the first reflection mirror 140 and the second reflection mirror 120 and amplifies the propagation laser 502 that passes through the active layer 130. When the propagation laser 502 travels on the waveguide 170, a portion of the propagation laser 502 is emitted as the output laser 501 and another portion of the propagation laser 502 is amplified by the active layer 130.

The active layer 130 is excited by a current that flows between the first electrode 150 and the second electrode 160. For example, the active layer 130 may be excited until it is in a luminescent state. The first electrode 150 and the second electrode 160 are provided to sandwich the active layer 130. For example, the first electrode 150 may be provided adjacent to the output surface 102 of the first reflection mirror 140. The second electrode 160 may form a bottom surface of the optical device 100 opposite to the output surface 102.

The first electrode 150 and the second electrode 160 are connected to the controller 300. The controller 300 supplies current between the first electrode 150 and the second electrode 160 and excites the active layer 130. The controller 300 adjusts an amplification of the propagation laser 502 by the active layer 130 by controlling the current that flows through the active layer 130.

As shown in FIG. 1, the first electrode 150 is formed not to overlap the input surface 101 irradiated with the incident laser 500 and the output surface 102 from which the output laser 501 is emitted. The input surface 101 is provided on the optical device 100 at an edge in a direction in which the incident laser 500 is irradiated. The output surface 102 is formed in a disk shape in a center of a bottom surface of the optical device 100, for example.

As described above, the optical device 100 propagates the propagation laser 502 along the waveguide 170 provided between the first reflection mirror 140 and the second reflection mirror 120, and emits the output laser 501 from the output surface 102. The optical device 100 includes a Vertical Cavity Surface Emitting LASER (VCSEL) for example. For example, a diameter of the output surface 102 of the optical device 100 may be 1 cm.

Figure 3:
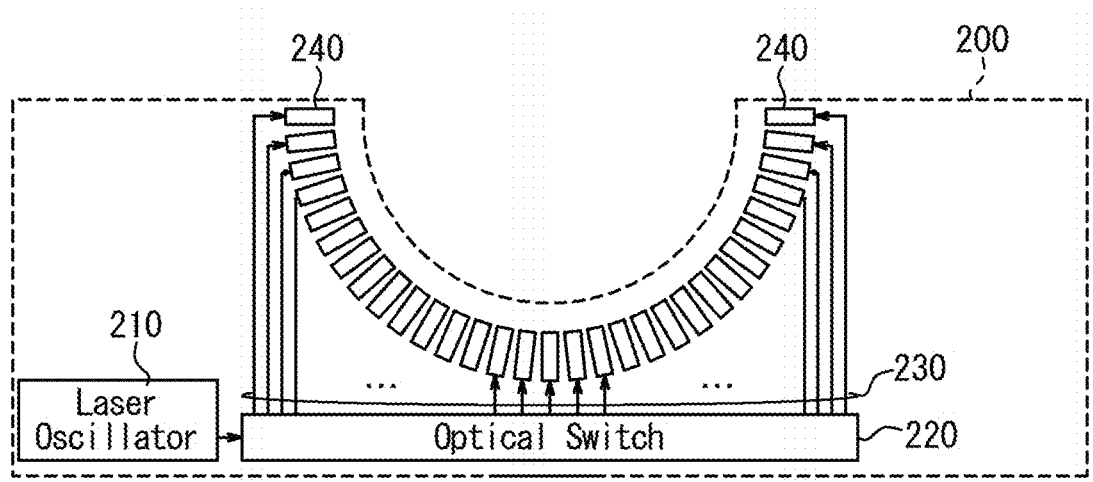
FIG. 3 is a schematic diagram that shows an example of a laser irradiation device according to an embodiment.

As shown in FIG. 3, for example, the laser irradiation device 200 is provided with a laser oscillator 210, an optical switch 220, waveguides 230 and a plurality of irradiation parts 240 (a first irradiation part 240-1, a second irradiation part 240-2, . . . , an i-th irradiation part 240-$i$, . . . , a k-th irradiation part 240-$k$, . . . , and an N-th irradiation part 240-N). The laser irradiation device 200 is configured to emit from the irradiation parts 240 the laser generated by the laser oscillator 210.

The laser oscillator 210 is configured to generate seed light with an adjusted wavelength to input in input ports of the optical switch 220. The laser oscillator 210 is connected to the controller 300 and generates the seed light based on control signal generated by the controller 300.

The optical switch 220 selectively outputs the seed light inputted by the laser oscillator 210 to an irradiation part 240 that irradiates the optical device 100 with this seed light as the incident laser 500. The optical switch 220 has a plurality of output ports and is configured to output the seed light inputted to the input port from an output port that is set among the plurality of output ports. The seed light outputted by the optical switch 220 is propagated to the irradiation part 240 connected to the output port. The optical switch 220 is connected to the controller 300 and sets the output port that outputs the seed light based on a selection control signal generated by the controller 300. The irradiation part 240 connected to the output port that is set irradiates the optical device 100 with the incident laser 500.

The optical switch 220 may have a plurality of input ports. In this case, the laser oscillator 210 inputs a plurality of seed lights corresponding to the input ports. A plurality of laser oscillators 210 may be provided in correspondence with the input ports. The controller 300 selects the laser oscillator 210 that generates the seed light, based on the direction of irradiating the incident laser 500, and sets the output port of the optical switch 220.

The waveguide 230 connects the output port of the optical switch 220 and the irradiation part 240, and propagates the seed light outputted from the optical switch 220 to the irradiation part 240. The waveguide 230 includes an optical fiber for example.

The irradiation part 240 irradiates the optical device 100 with the inputted seed light as the incident laser 500. For example, each of the irradiation parts 240 irradiates the incident laser 500 in different direction, and irradiates the first incident laser 500-1, the second incident laser 500-2, and the N-th incident laser 500-N. In particular, the first irradiation part 240-1 irradiates the optical device 100 with the first incident laser 500-1. The second irradiation part 240-2 irradiates the optical device 100 with the second incident laser 500-2. The i-th irradiation part 240-i irradiates the optical device 100 with the i-th incident laser 500-i. The k-th irradiation part 240-k irradiates the optical device 100 with the k-th incident laser 500-k. The N-th irradiation part 240-N irradiates the optical device 100 with the N-th incident laser 500-N. The irradiation part 240 includes, for example, a collimator. The plurality of irradiation parts 240 may be formed of a fiber array with bundled optical fibers, for example. A part of the plurality of irradiation parts 240, such as the first irradiation part 240-1 and the second irradiation part 240-2, may irradiate the incident laser 500 in a same direction.

The irradiation parts 240 are arranged so as to surround the optical device 100. For example, when viewed from a normal direction of the output surface 102, the irradiation parts 240 are arranged so as to surround a half of the optical device 100, and each of the irradiation parts 240 is arranged at equal intervals.

For ease of understanding, a spherical coordinate system having the center of the output surface 102 as the origin will be used in the explanation. A distance from the origin will be referred to as a radius r, an angle from the normal line 610 of the output surface 102 will be referred to as a polar angle θ and a direction in a planar direction of the output surface 102 when viewed from the origin will be referred to as azimuthal φ.

A method of controlling the azimuthal φ of the emission direction of the output laser 501 will be described. The laser irradiation device 200 irradiate the optical device 100 with the incident lasers 500 from the i-th irradiation part 240-i and the k-th irradiation part 240-k, for example. The azimuths φ of the irradiation directions of the incident lasers 500 that the i-th irradiation part 240-i and the k-th irradiation part 240-k irradiate are not parallel to each other. Since the input surface 101 is a plane, the azimuthal φ of the traveling direction of the i-th propagation laser 502-i corresponding to the i-th incident laser 500-i and the azimuthal φ of the traveling direction of the k-th propagation laser 502-k corresponding to the k-th incident laser 500-k are not parallel to each other. Since the output surface 102 is a plane, the azimuthal φ of the emission direction of the i-th output laser 501-i corresponding to the i-th propagation laser 502-i and the azimuthal φ of the emission direction of the k-th output laser 501-k corresponding to the k-th propagation laser 502-k are not parallel to each other. As described above, the azimuthal φ of the emission direction of the output laser 501 when the incident laser 500 is irradiated from the i-th irradiation part 240-i and the azimuthal φ of the emission direction of the output laser 501 when the incident laser 500 is irradiated from the k-th irradiation part 240-k are different. The azimuthal φ of the emission direction of the output laser 501 can be changed by changing the irradiation part 240 that irradiates the incident laser 500.

As described above, the laser apparatus 1 can control the azimuthal φ of the emission direction of the output laser 501 by changing the irradiation part 240 that irradiates the incident laser 500. In other words, the azimuthal φ of the emission direction of the output laser 501 can be controlled by irradiation by the laser irradiation device 200 of a plurality of incident lasers 500 of which the azimuths φ of the traveling directions are not parallel to each other, in the waveguide 170. The plurality of optical paths of the propagation lasers 502 that are irradiated from the plurality of irradiation parts 240 and travel inside the optical device 100 may cross to each other, when viewed from a normal direction of the output surface 102, inside the waveguide 170 formed in the optical device 100. For example, an optical path of the i-th propagation laser 502-i and an optical path of the k-th propagation laser 502-k may cross, when viewed from the normal direction of the output surface 102, inside the waveguide 170. It should be noted that two irradiation parts 240 among the plurality of irradiation parts 240 may irradiate the optical device 100 with incident lasers 500 from parallel directions.

The polar angle θ of the emission direction of the output laser 501 can be changed by changing the wavelength of the incident laser 500 irradiated by the irradiation part 240. As shown in FIG. 2, the incident laser 500 is irradiated to the input surface 101 from a direction inclined with respect to the normal direction of the input surface 101, and is guided inside the optical device 100 as the propagation laser 502. The propagation laser 502 is reflected by the first reflection mirror 140 and the second reflection mirror 120. The following formula (1) is held based on Bragg's law, with $\theta_i$ as the incident angle 506 of the propagation laser 502 at the first reflection mirror 140.

$$\sin\theta_i = \sqrt{1 - \left(\frac{\lambda}{\lambda_c}\right)^2} \tag{1}$$

Herein, the incident angle 506 indicates an angle between the incident direction of the propagation laser 502 with respect to the first reflection mirror 140 and the normal line 610 of the output surface 102. In addition, λ indicates the wavelength of the propagation laser 502 and $\lambda_c$ indicates the cut-off wavelength of the waveguide 170.

The first reflection mirror 140 transmits a portion of the propagation laser 502 that incidents with the incident angle 506 as the output laser 501. The output laser 501 is refracted at the output surface 102 provided to the first reflection mirror 140 and is emitted. Since the wavelength of the output laser 501 is equal to the wavelength of the propagation laser 502, the following formula (2) is held when the output angle 505, that indicates an angle between the direction in which the output laser 501 is emitted and the normal line 610 of the output surface 102, is referred to as $\theta_0$.

$$\sin\theta_o = \frac{n_{air}}{n_{wg}} \sqrt{1 - \left(\frac{\lambda}{\lambda_c}\right)^2} \quad (2)$$

Herein, $n_{air}$ indicates a refractive index in the atmosphere and $n_{wg}$ indicates a refractive index in the waveguide 170.

Since the wavelength of the propagation laser 502 and the wavelength of the output laser 501 are equal to the wavelength of the incident laser 500, the output angle 505 changes based on the wavelength of the incident laser 500. Since the output angle 505 indicates the polar angle $\theta$ of the direction in which the output laser 501 is emitted, the polar angle $\theta$ of the direction in which the output laser 501 is emitted is changed based on the wavelength of the incident laser 500. As a result, the laser apparatus 1 can control the polar angle $\theta$ of the irradiation direction of the output laser 501 by changing the wavelength of the incident laser 500.

As described above, the laser apparatus 1 can emit the emitted output laser 501 to a desired direction by controlling the irradiation part 240 that irradiates the incident laser 500 and the wavelength of the laser that the irradiation part 240 irradiates. Since the laser apparatus 1 can non-mechanically control the irradiation direction of the output laser 501, it can change the irradiation direction of the output laser 501 faster than a conventional way. In addition, the laser apparatus 1 can be formed smaller than a conventional way. For example, the laser apparatus 1 may be formed with a diameter of the output surface 102 of the optical device 100 as 1 cm, may be arranged at a high density, and may be applied to a laser array.

When the laser apparatus 1 emits the output laser 501, the controller 300 controls the optical switch 220 and the laser oscillator 210 in accordance with the direction of emitting the output laser 501. For example, the controller 300 controls the wavelength of the seed light that the laser oscillator 210 generates, in accordance with the polar angle $\theta$ of the direction in which the output laser 501 is to be emitted. When the wavelength of the seed light to be generated is made larger, the output angle 505 in which the output laser 501 is emitted becomes smaller. When the wavelength of the seed light to be generated is made smaller, the output angle 505 in which the output laser 501 is emitted becomes larger. As described above, controller 300 can emit the output laser 501 in a desired direction with the polar angle $\theta$, by changing the wavelength of the seed light that the laser oscillator 210 generates.

The controller 300 controls the optical switch 220 in accordance with the azimuthal $\phi$ of the emission direction of the output laser 501, for example. For example, in FIG. 1, when the controller 300 controls the optical switch 220 so as to irradiate the incident laser 500 from the first irradiation part 240-1, the output laser 501 is emitted to a right direction of FIG. 1. When the controller 300 controls the optical switch 220 so as to irradiate the incident laser 500 from the N-th irradiation part 240-N, the output laser 501 is irradiated to a left direction in FIG. 1. As described above, the controller 300 can emit the output laser 501 to the desired direction in the azimuthal $\phi$, by controlling the optical switch 220.

The controller 300 controls the current that flows in the active layer 130 of the optical device 100 in order to adjust the energy of the output laser 501. The controller 300 may control the energy of the seed light that the laser oscillator 210 generates. The energy of the output laser 501 can be adjusted by controlling the energy of the seed light that the laser oscillator 210 generates and the current that flows in the active layer 130.

A cooling device may be provided on a back side of the optical device 100 opposite to the output surface 102, so as to be adjacent to the second electrode 160 for example. The optical device 100 generates heat when the propagation laser 502 travels on the waveguide 170 inside the optical device 100. By providing the cooling device in contact with the second electrode 160, the optical device 100 can be efficiently cooled.

Figure 4:
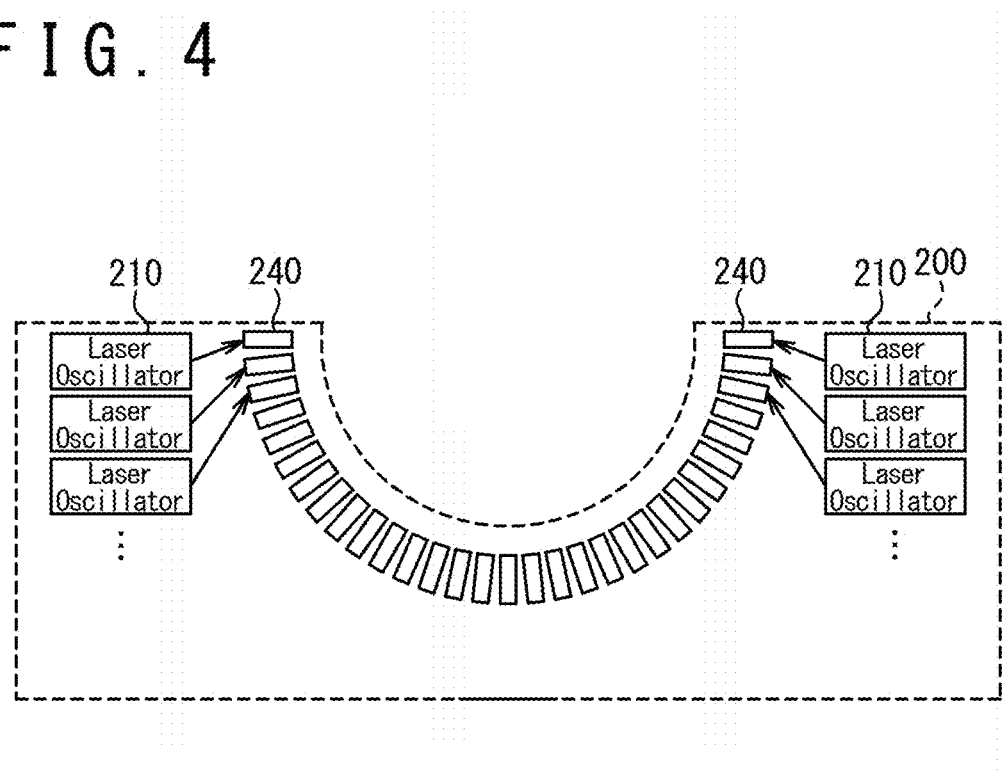
FIG. 4 is a schematic diagram that shows an example of a laser irradiation device according to an embodiment.

As shown in FIG. 4, the laser irradiation device 200 may be provided with a plurality of laser oscillators 210 respectively corresponding to the plurality of irradiation parts 240. In this case, the controller 300 selects a laser oscillator 210 that generates the seed light, in accordance with the azimuthal $\phi$ of the direction in which the output laser 501 is to be irradiated. The seed light generated by the laser oscillator 210 is emitted by the corresponding irradiation part 240 as the incident laser 500. As a result, the controller 300 can control the azimuthal $\phi$ to which the output laser 501 is emitted.

Figure 5:
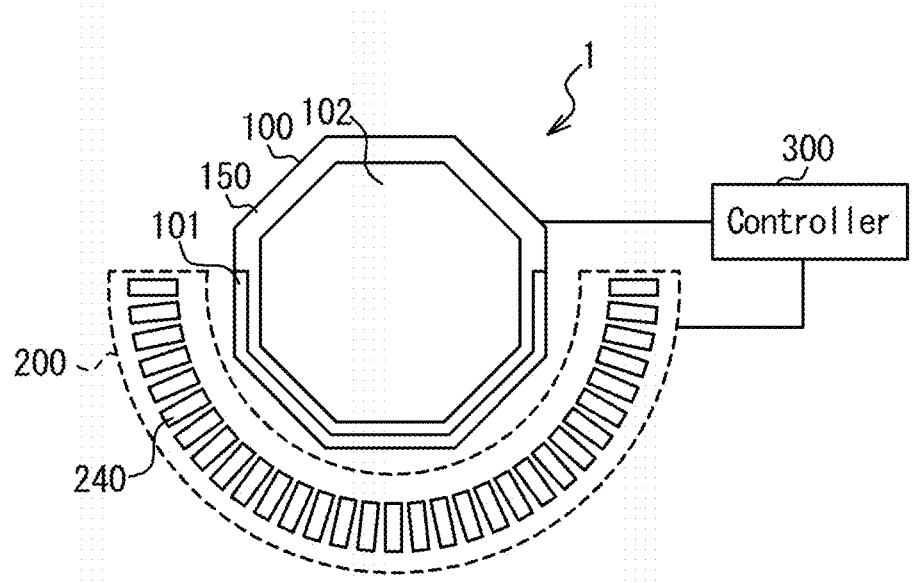
FIG. 5 is a schematic diagram that shows an example of a laser apparatus according to an embodiment.
Figure 6:
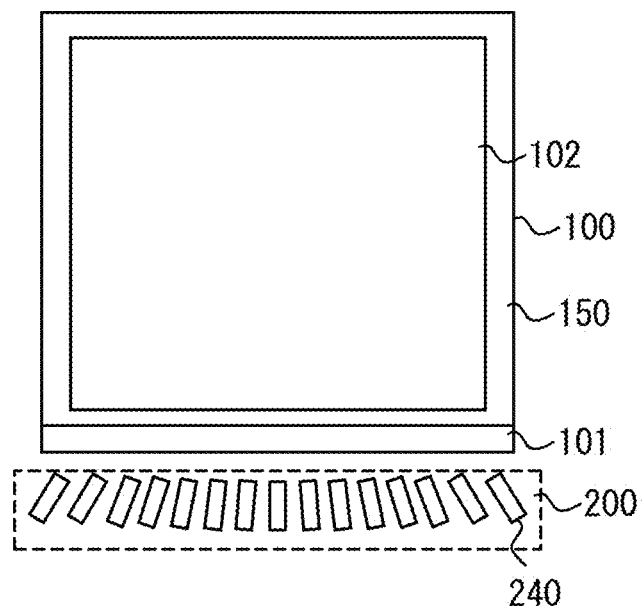
FIG. 6 is a schematic diagram that shows an example of a laser apparatus according to an embodiment.

As shown in FIG. 5, the optical device 100 may be formed as a polygonal prism, as an octagonal prism for example. Since the input surface 101 and the output surface 102 are formed as planes, the azimuthal $\phi$ of the traveling direction of the propagation laser 502 in the optical device 100 changes in accordance with the azimuthal $\phi$ in which the incident laser 500 is irradiated to the input surface 101. Even if the optical device 100 is formed as a polygonal prism, the controller 300 can control the azimuthal $\phi$ of the irradiation direction of the output laser 501 by controlling the irradiation part 240 that irradiates the incident laser 500. In addition, as shown in FIG. 6, the optical device 100 may be formed as a quadrangular prism.

Figure 7:
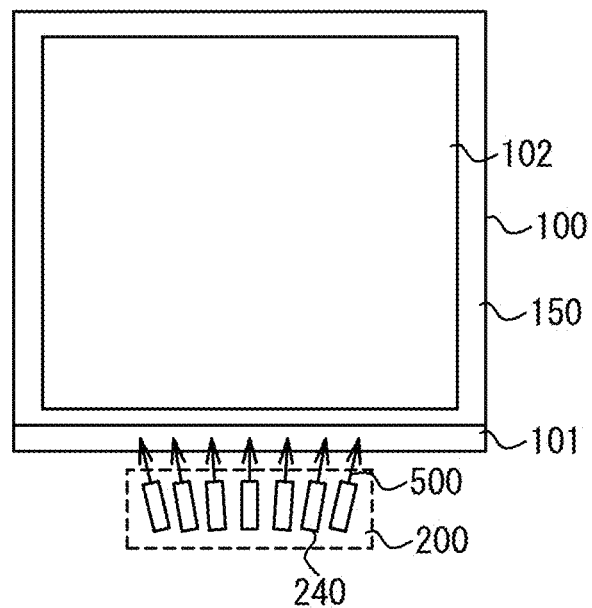
FIG. 7 is a schematic diagram that shows an example of a laser apparatus according to an embodiment.

An arrangement of the irradiation parts 240 may be arbitrarily selected as long as the incident lasers 500 can be irradiated to the optical device 100 from a plurality of directions. For example, as shown in FIG. 6, the irradiation parts 240 may be arranged on a same straight line. In addition, as shown in FIG. 7, the irradiation parts 240 may be arranged so as to irradiate the incident lasers 500 in a radial pattern.

Figure 8:
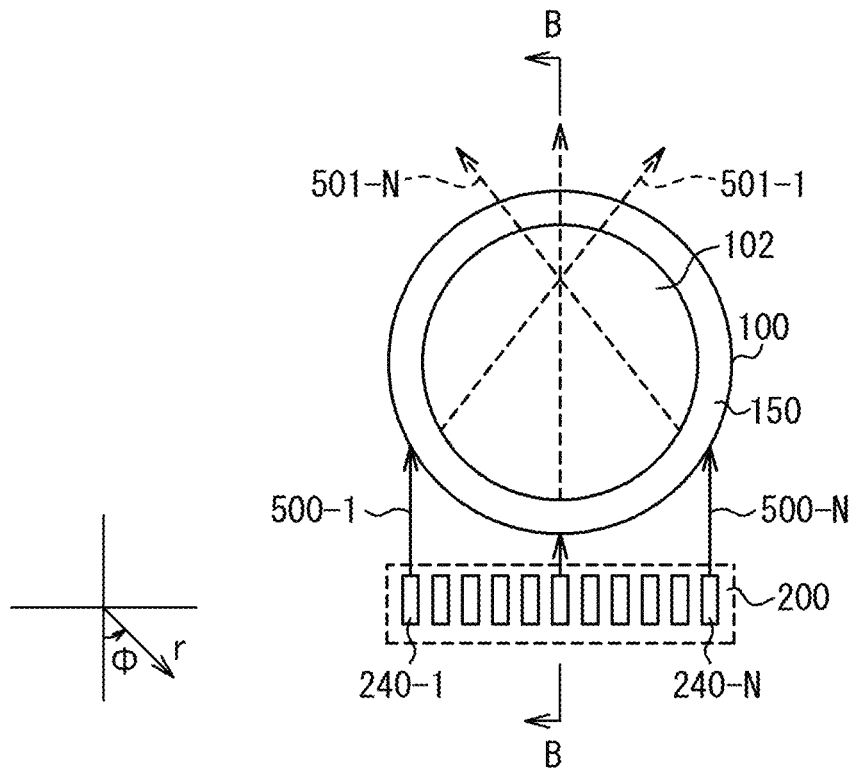
FIG. 8 is a schematic diagram that shows an example of a laser apparatus according to an embodiment.
Figure 9:
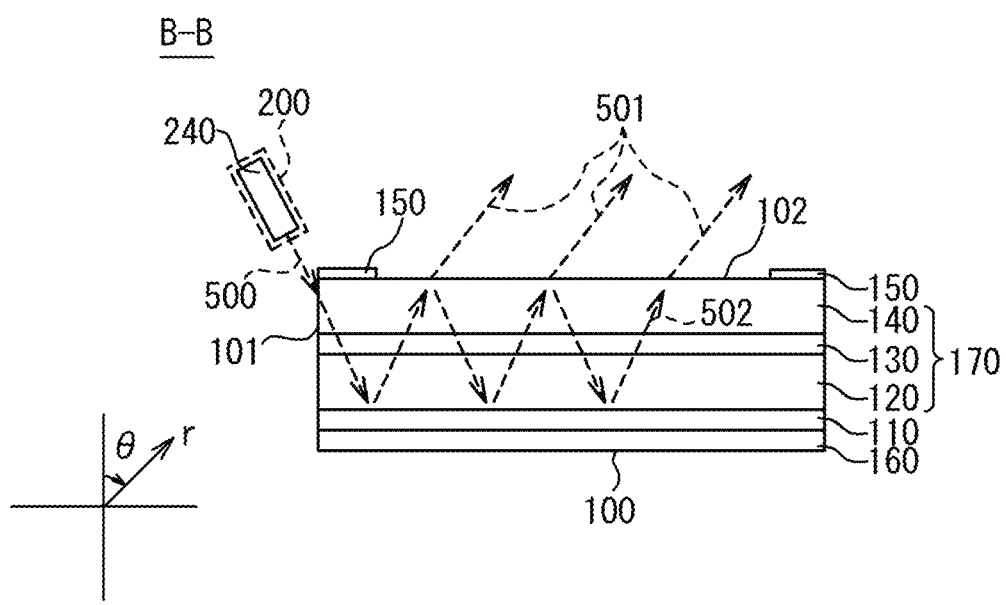
FIG. 9 is a B-B cross-sectional view of the laser apparatus in FIG. 8.

The input surface 101 and the laser irradiation device 200 may be arbitrarily selected as long as the laser irradiation device 200 can irradiate a plurality of incident lasers 500 each of which the azimuthal $\phi$ of the traveling direction of the propagation laser 502 is different in the waveguide 170 of the optical device 100. For example, as shown in FIGS. 8 and 9, the input surface 101 may be provided on a side surface of the optical device 100. In this case, the plurality of irradiation parts 240 may irradiate, respectively, a plurality of incident lasers 500 of which the azimuths $\phi$ are parallel to each other. For example, when viewed from the normal direction of the output surface 102, the incident angle at the input surface 101 of the first incident laser 500-1 irradiated by the first irradiation part 240-1 is different from the incident angle at the input surface 101 of the N-th incident laser 500-N irradiated by the N-th irradiation part 240-N. Since the incident angles of the incident lasers 500 are different, the refraction indexes at the input surface 101 are also different. Since the refraction indexes are different, the azimuthal $\phi$ of the traveling direction of the first propagation laser 502-1 is different from the azimuthal $\phi$ of the traveling direction of the N-th propagation laser 502-N. Since the azimuths $\phi$ of the traveling directions of the propagation lasers 502 are different, the azimuths $\phi$ of the irradiation directions of the output lasers 501 are also different. As described above, the lasers irradiated by the irradiation parts 240 may be configured to have different angles of refraction at the input surface 101 when viewed in the normal direction of the output surface 102. With such a configuration, the azimuthal $\phi$ of the emission direction of the output laser 501 can be changed by controlling the irradiation parts 240 that irradiate the incident lasers 500. It should be noted that even if incident lasers 500 of which the azimuths $\phi$ are not parallel are irradiated to the input surface 101, the azimuthal $\phi$ of the emission direction of the output laser 501 can be changed similarly.

Figure 10:
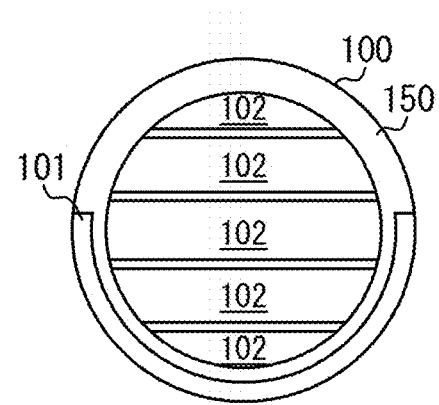
FIG. 10 is a schematic diagram that shows an example of an optical device according to an embodiment.

The output surface 102 of the optical device 100 only needs to output the output laser 501 and an arbitrary shape thereof may be selected. For example, as shown in FIG. 10, the output surface 102 may be divided by the first electrode 150 into a plurality of areas. By arranging the first electrode 150 in a center portion of the bottom surface of the optical device 100, a difference of values of current that flows in the active layer 130, due to difference of location in the active layer 130, can be suppressed from occurring. As a result, a quality of the output laser 501 can be improved.

Although the present invention has been described above with reference to the embodiments and the examples, the present invention is not limited to the embodiments and the examples described above. A person skilled in the art can appropriately make various modifications or changes to the structure and details of the present invention within the scope of the technical idea of the present invention described in the claims. In addition, the above-described embodiments and examples may be combined as long as there is no technical contradiction. For example, the process described above is an example, and the order and processing contents of each step may be changed as long as the function is not inhibited. In addition, the described configuration may be arbitrarily changed as long as the function is not inhibited. For example, the controller 300 may be provided outside the laser apparatus 1. When the propagation laser 502 does not need to be amplified, the active layer 130, the first electrode 150, the second electrode 160 and the like may be omitted. The optical device 100 may be provided with a layer, that does not inhibit the function, between each layer. The optical switch 220 may directly irradiate the incident laser 500.

It should be noted that the present application claims priority based on the Japanese Patent Application No. 2018-216796 filed on Nov. 19, 2018 and herein incorporates all disclosure thereof by reference.

The invention claimed is:

1. A laser apparatus comprising:
    an optical device having a first reflection mirror and a second reflection mirror arranged to face each other and one waveguide formed between the first reflection minor and the second reflection mirror; and
    a laser irradiation device configured to irradiate the optical device with laser,
    wherein the optical device is configured so that at least a portion of the laser travels on the waveguide by being reflected by the first reflection minor and the second reflection minor in order,
    wherein the optical device comprises an output surface configured to emit a portion of the laser,
    wherein the first reflection mirror transmits a portion of the laser and reflects another portion of the laser,
    wherein the output surface is formed on a surface of the first reflection mirror,
    wherein the laser irradiation device comprises a plurality of irradiation parts including a first irradiation part configured to irradiate a first laser and a second irradiation part configured to irradiate a second laser,
    wherein an irradiation direction in which the first irradiation part irradiates the first laser to the waveguide of the optical device is not parallel to an irradiation direction in which the second irradiation part irradiates the second laser to the waveguide of the optical device when viewed from a normal direction of the output surface, and
    wherein a traveling direction of the first laser is not parallel to a traveling direction of the second laser in the waveguide when viewed from the normal direction of the output surface.

2. The laser apparatus according to claim 1, wherein an optical path of the first laser intersects an optical path of the second laser in the waveguide when viewed from the normal direction of the output surface.

3. The laser apparatus according to claim 1, wherein the laser irradiation device comprises:
    a laser oscillator configured to generate seed light; and
    an optical switch configured to receive the seed light and selectively output the seed light to an irradiation part among the plurality of irradiation parts that irradiates the optical device with the seed light as the laser.

4. The laser apparatus according to claim 1, wherein the laser irradiation device further comprises:
    a plurality of laser oscillators configured to generate seed light; and
    a controller configured to select the laser to irradiate the optical device with by selecting a laser oscillator that generates the seed light from the plurality of laser oscillators.

5. The laser apparatus according to claim 1, wherein the optical device further comprises an active layer between the first reflection mirror and the second reflection mirror, the active layer configured to amplify the laser.

6. The laser apparatus according to claim 5, wherein the optical device further comprises an electrode configured to excite the active layer, and
    wherein the output surface is divided to a plurality of output surfaces by the electrode.

7. The laser apparatus according to claim 1, wherein the optical device further comprises an input surface configured to be irradiated with the laser, and
    wherein the input surface is a plane parallel to the output surface.

8. The laser apparatus according to claim 1, wherein an angle in that the first laser is refracted is different from an angle in that the second laser is refracted, in an input surface of the optical device when viewed from the normal direction of the output surface.

* * * * *